United States Patent

Pajarre et al.

[19]

[11] Patent Number: 6,131,105
[45] Date of Patent: *Oct. 10, 2000

[54] CALCULATION OF A SCALAR PRODUCT IN A DIRECT-TYPE FIR FILTER

[75] Inventors: Eero Pajarre; Ville Eerola, both of Tampere; Tapio Saramäki, Pirkkala; Tapani Ritoniemi, Tampere; Timo Husu, Joensuu; Seppo Ingalsuo, Tampere, all of Finland

[73] Assignee: Tritech Microelectronics LTD, Singapore, Singapore

[ * ] Notice: This patent issued on a continued prosecution application filed under 37 CFR 1.53(d), and is subject to the twenty year patent term provisions of 35 U.S.C. 154(a)(2).

[21] Appl. No.: 08/505,257

[22] PCT Filed: Dec. 16, 1994

[86] PCT No.: PCT/FI94/00568

§ 371 Date: Jan. 23, 1996

§ 102(e) Date: Jan. 23, 1996

[87] PCT Pub. No.: WO95/17708

PCT Pub. Date: Jun. 29, 1995

[30] Foreign Application Priority Data

Dec. 17, 1993  [FI]  Finland ..................................... 935709

[51] Int. Cl.[7] ............................. G06F 17/10; G06F 15/00; G06F 7/00
[52] U.S. Cl. ........................... 708/319; 708/603; 333/166
[58] Field of Search ........................... 364/724.1, 724.16, 364/759, 724.19; 333/70, 166, 167, 28 R; 348/614; 375/232, 229, 350; 235/164; 708/300, 301, 313, 314, 319, 320, 321, 322, 323, 603, 626, 627

[56] References Cited

U.S. PATENT DOCUMENTS

| | | | |
|---|---|---|---|
| 3,979,701 | 9/1976 | Tomozawa | 333/166 |
| 4,027,147 | 5/1977 | Majos et al. | 708/627 |
| 4,422,156 | 12/1983 | Sano | 708/320 |
| 5,025,406 | 6/1991 | Klank et al. | 708/322 |
| 5,166,895 | 11/1992 | Makino | 708/319 |
| 5,383,145 | 1/1995 | Sakiyama et al. | 708/319 |
| 5,481,316 | 1/1996 | Patel | 348/614 |
| 5,500,874 | 3/1996 | Terrell | 375/232 |
| 5,528,531 | 6/1996 | Toyama et al. | 708/627 |

FOREIGN PATENT DOCUMENTS 9423493  10/1994  WIPO .

*Primary Examiner*—Emmanuel L. Moise
*Attorney, Agent, or Firm*—George O. Saile; Stephen B. Ackerman; Billy J. Knowles

[57] ABSTRACT

The invention relates to a direct-type FIR filter, a method for calculating a scalar product in a FIR filter, and a method for designing a direct-type FIR filter. Successive words of a digital input signal are delayed in a delay line having delays (50A–50D) of the duration of one word, and the scalar product between the variously delayed words derived from the delay line and the corresponding constant coefficients is calculated. In accordance with the invention, calculation of the scalar product comprises a) combining the bits of words at the input (X0) and outputs (X1–X4) of the delay line bit by bit in a network of bit-serial subtractor and/or adder elements (51–56) wherein at least one of the bit-serial elements is involved in the multiplication operation of at least two different coefficients, and b) multiplying (49A–K) the multiplication results from the network by powers of two, and summing together (45–48) the results to yield the scalar product.

15 Claims, 3 Drawing Sheets

CALCULATION OF A SCALAR PRODUCT IN A DIRECT-TYPE FIR FILTER

FIELD OF THE INVENTION

The present invention relates to a digital direct-type FIR filter, and in particular to calculation of a scalar product in a direct-type FIR filter.

BACKGROUND OF THE INVENTION

A digital filter is a software or a specially designed electronic circuit processing discrete digital signal samples to perform a desired transfer function operation on said signal. The Z transfer function of a digital, i.e. discrete time, FIR (Finite Impulse Response) filter has the generic form $$H(z) = \frac{Y(z)}{X(z)} = \sum_{i=0}^{N} a_i \times z^{-i} \quad (1)$$

where $H(z)$ is the transfer function of the filter, $Y(z)$ and $X(z)$ represent the output and input of the filter respectively, $a_i$ represent constant coefficients, i.e. tap coefficients, and $z^{-i}$ represents a delay of i samples. The properties of a FIR filter are solely dependent on the tap coefficients $a_i$, and thus determination of these coefficients is required in order to obtain the desired characteristics for the filter. There are several methods for determining the coefficients. The non-recursive discrete time filter in accordance with equation (1) is normally represented as a block diagram as shown in FIGS. 1 and 2. FIG. 1 illustrates a direct-type FIR (Finite Impulse Response) filter and FIG. 2 a transposed FIR filter. The filtering function in accordance with equation (1) can be realized by both types of discrete time filter, but the present invention relates to a direct-type FIR filter according to FIG. 1. As is apparent from FIGS. 1 and 2, the discrete time filter is illustrated as a block diagram wherein square blocks 1 perform delaying of the information by one sample $z^{-1}$, triangular blocks 2 represent multiplication operations, and circles 3 represent adders.

As stated previously, the characteristics of the filter are dependent on the values of the tap coefficients $a_i$. Prior art direct-type FIR filters exist in which a discrete multiplier unit for each tap coefficient is employed. The drawback of this approach is the large number of multiplier units required, which occupy a considerable area on a semiconductor chip when embodied as an integrated circuit and are therefore costly. A prior art approach is known in which the tap coefficients are simple sums of powers of two, i.e. the coefficients are limited to the form $2^{-a}+2^{-b}+2^{-c}$. Such an approach is attended by the drawback of limitations in the possible coefficients to be realized. These limitations can substantially complicate the realization of the desired signal processing function $H(z)$.

Still another prior art solution entails the use of a fast multiplier and memory for realizing the filter. Such a solution is illustrated in FIG. 3, wherein the necessary delays $z^{-1}$ are generated by buffering the values of the input signal $X(z)$ into a RAM memory 41 prior to inputting them to a multiplier 42, in which they are multiplied by coefficients $a_i$ derived from a ROM memory. Thereafter the multiplication results are supplied to an adder 44 wherein they are summed with the filter output $Y(z)$. The drawback of such a solution is the chip area occupied by the fast multiplier unit 42. Further drawbacks include the high power consumption of the multiplier unit 42 and, in certain applications, the electromagnetic interference produced thereby in other circuitry. Furthermore, on account of the limited speed of the multiplier unit, only a limited number of coefficients $a_i$ can be realized with one multiplier unit. Complex structures require several multiplier units and a complex control logic.

DISCLOSURE OF THE INVENTION

The object of the present invention is a direct-type digital FIR filter that can be embodied as an integrated circuit with several coefficients so as to occupy substantially less chip area in integrated circuit configuration than the filters implemented by the prior art techniques.

Another object of the present invention is a digital filter suitable for comparatively high clock frequencies.

A further object of the present invention is a digital filter enabling realization of arbitrary coefficients automatically.

These and other objects and advantages of the invention are achieved with a method for calculating a scalar product in a direct-type digital FIR filter, the method comprising delaying successive words of a digital input signal in a delay line having delays of the duration of one word, and calculating the scalar product between the variously delayed words derived from the delay line and the corresponding coefficients, the method being characterized in that the calculation step comprises combining the bits of words at the input and outputs of the delay line bit by bit in a network of bit-serial subtractor and/or adder elements wherein at least one of said bit-serial subtractor and/or adder elements is involved in the multiplication operation of at least two different coefficients, multiplying the multiplication results from the network of bit-serial subtractor and/or adder elements by powers of two, and summing together the results to yield said scalar product.

Another aspect of the invention is a direct-type digital FIR filter, comprising a delay line having an input for receiving digital words in serial form, a plurality of one-word delays and an output after each delay;

calculation means for calculating the scalar product between the words at the input and each output of the delay line and the corresponding coefficients;

an output to which the calculated scalar product is applied, the filter being characterized in that said calculation means comprise a plurality of bit-serial subtractor and/or adder elements for combining bits of words at the input and each output of the delay line, said bit-serial subtractor and/or adder elements forming a network wherein at least one of said bit-serial subtractor and/or adder elements is involved in the multiplication operation of at least two different coefficients, means for multiplying the multiplication results from the network of bit-serial subtractor and/or adder elements by powers of two and summing together the results to yield said scalar product.

One aspect of the invention is a method for designing a direct-type digital filter, comprising a step of determining the coefficients required in the filter. This method is characterized in accordance with the invention by further steps of designing a network of bit-serial subtractor and/or adder elements for the filter, wherein the number of said bit-serial elements is minimized taking into account performance criteria of the filter, so that a maximum number of said bit-serial elements are involved in the multiplication operation of more than one different coefficients, designing an output register performing multiplication by a power of two and summing together the results from said network, said register comprising one-bit delay elements and bit-serial adder and subtractor elements.

In the present invention, the scalar product is calculated by combining values derived from the delay line in bit-serial adder and/or subtractor elements, so that at least some of the adder and/or subtractor elements are used to provide the mantissa of more than one coefficient. In other words, the "partial sum" or "partial difference" outputted by a specific adder or subtractor element can be used on the next level of the adder and/or subtractor element network to produce the mantissas of several coefficients simultaneously. Furthermore, in the arrangement of the invention the combined use of adder and subtractor elements in producing the coefficients enables the number of calculation elements (+/−operators) to be minimized. The products given by the network of calculation elements are multiplied by the exponent of the respective coefficient and summed together to produce the final scalar product. The arrangement of the invention affords good round-off and truncation behaviour. The scalar product is rounded off or truncated only once, and thus the error in the scalar product is, on an average, only ½ least significant bits. Multiplication by a power of two and summation are preferably performed on all coefficients in the same output register, which is comprised of one-bit delays and bit-serial adder and subtractor elements. Thus the number of necessary delays can be optimized as compared with a case where each coefficient has dedicated calculation elements, delay elements, for multiplication by a power of two.

By means of the invention, the network of bit-serial adder and subtractor elements can be optimized by finding the sum and/or difference of powers of two for the coefficients required, so as to considerably diminish the requisite number of calculation elements in comparison with the prior art solutions. At the same time, the requisite number of series-connected elements is characteristically diminished. With the construction of the invention, arbitrary coefficients can be realized. Still another advantage of the invention is a low number of logic levels, and thus the maximum operating frequency is very high. When the invention is realized as an integrated circuit, the silicon area occupation required is less than half the area required by the digital filter shown in FIG. 3 which includes a multiplier and RAM and ROM memories.

BRIEF DESCRIPTION OF THE DRAWINGS

In the following the invention will be set forth by means of preferred embodiments with reference to the accompanying drawing, wherein.

PREFERRED EMBODIMENT OF THE INVENTION

Figure 1:
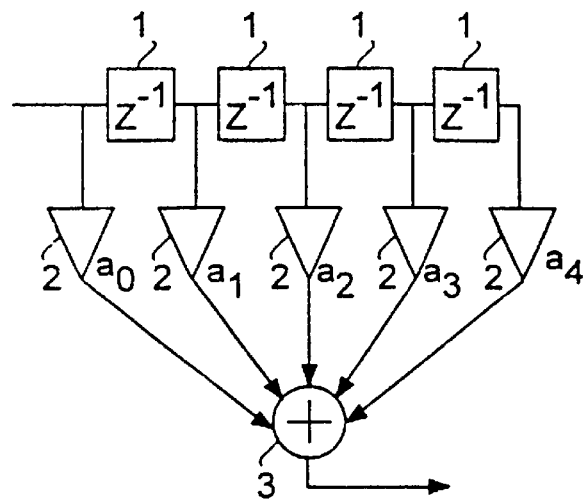
FIG. 1 is a block diagram of a direct-type digital FIR filter.
Figure 2:
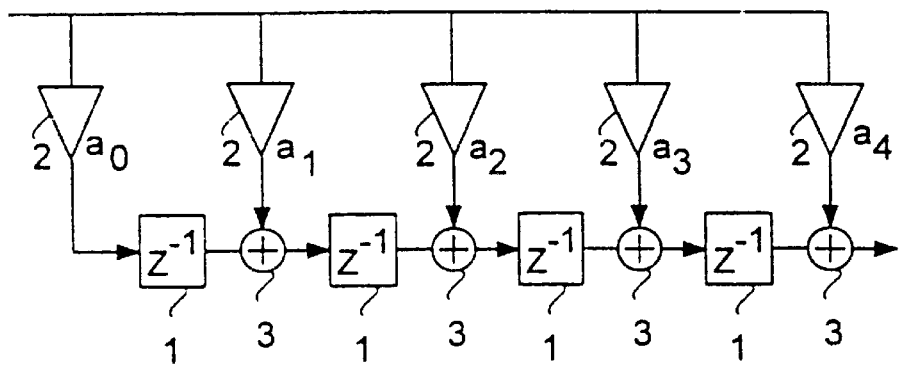
FIG. 2 is a block diagram of a transposed digital FIR filter.
Figure 3:
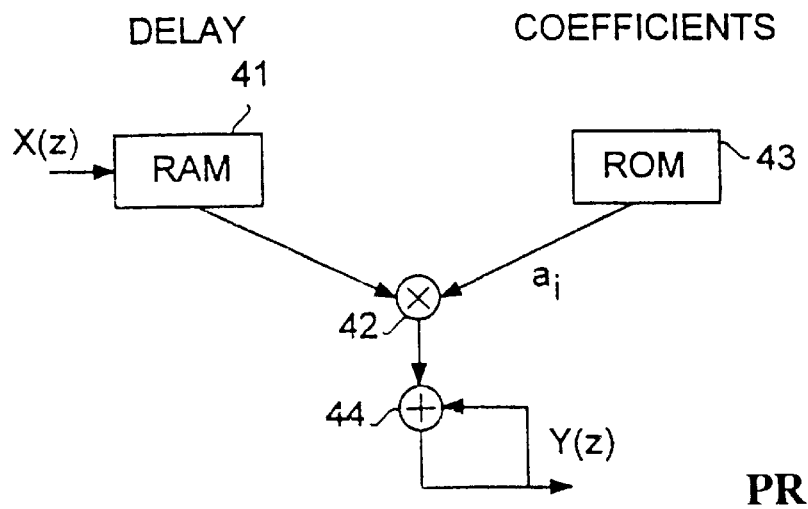
FIG. 3 is a block diagram of a prior art digital filter implemented by a fast multiplier and memories.
Figure 4:
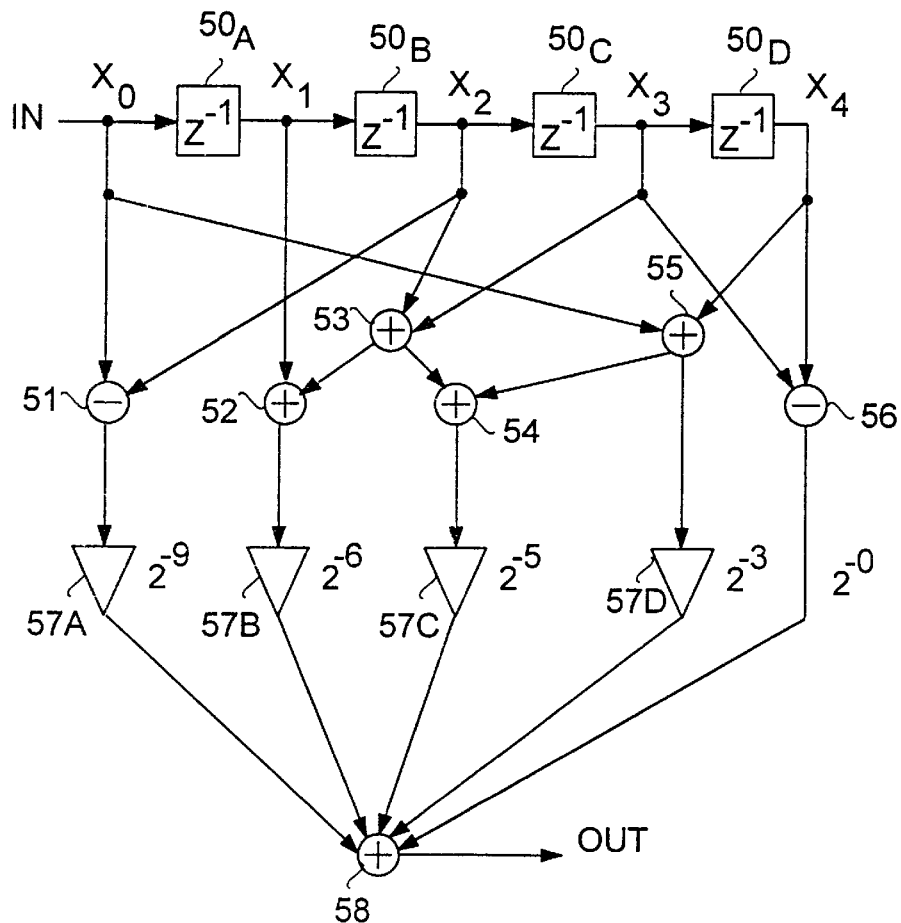
FIG. 4 is a block diagram of a digital filter of the invention with five coefficients.

Reference will now be made to FIG. 4, showing a five-coefficient direct-type digital FIR filter implemented in accordance with the invention. After the input IN, the filter comprises a delay line having four delay blocks 50A, 50B, 50C and 50D, each having a length of one word ($z^{-1}$). Each delay block is made up of N one-bit delay elements 49, as in delay block 50D in FIG. 5. N is the word width of the filter. The number sequence X obtained at the input IN is supplied to delay line 50A–50D in bit-serial form, each value as N successive bits, the least significant bit LSB occurring first. The words are clocked through the delay line in such as way that each word is shifted one bit at each clock cycle. In other words, during N successive clock cycles each bit of word appears in turn at the one-bit output of the respective delay block. Thus the delay line 50A–50D (the input included) provides an output of five variously delayed values $x_0$, $x_1$, $x_2$, $x_3$ and $x_4$ in bit-serial form. The values thus obtained should be multiplied by the corresponding tap coefficients $a_0$, $a_1$, $a_2$, $a_3$ and $a_4$, whereafter the products obtained are summed together to give the desired scalar product, as in the schematic block diagram of a direct-type FIR filter of FIG. 1.

A network of combining elements 51, 52, 53, 54, 55 and 56 is coupled to the outputs of the delay line for multiplication of the words x0–x4 by tap coefficients $a_1$–$a_4$ by combining the one-bit outputs of the delay line. The network of combining elements comprises bit-serial adder and subtractor elements 51, 52, 53, 54, 55 and 56 employing bit-serial arithmetic on several levels. In accordance with the basic concept of the invention, it has been sought to minimize the number of calculation elements taking into account certain performance criteria for the filter, so that the same calculation elements are employed to produce more than one different tap coefficients. In the exemplary case of FIG. 4, five coefficients are formed by employing only six bit-serial (one-bit) arithmetic elements. For instance, the inputs of the adder element 53 are provided by the outputs $x_2$ and $x_3$ of the delay line. On the other hand, the output value $x_2 + x_3$ of the adder element 53 provides an input for adder elements 52 and 54 on the next network level. The calculation elements 51, 52, 54, 55 and 56 respectively provide five outputs, which are then multiplied by the requisite power of two in multiplier units 57A, 57B, 57C, 57D and 57E. The outputs of multiplier units 57A–57E are summed together in an adder 58 to obtain the desired scalar product $$Y = \sum_{i=0}^{N} a_i x_i \qquad (2)$$

Delaying of a bit-serial value for the duration of one bit corresponds to multiplying the value by two. Therefore, the multiplier units 57A–57E have in one embodiment of the invention been configured by using one-bit delay elements, one delay element for each power of two. Thus for example multiplier unit 57A has nine one-bit delays and multiplier unit 57D three one-bit delays. Hence the embodiment of FIG. 4 requires a total of 23 one-bit delay elements to implement the multiplier units 57A–57D.

Figure 5:
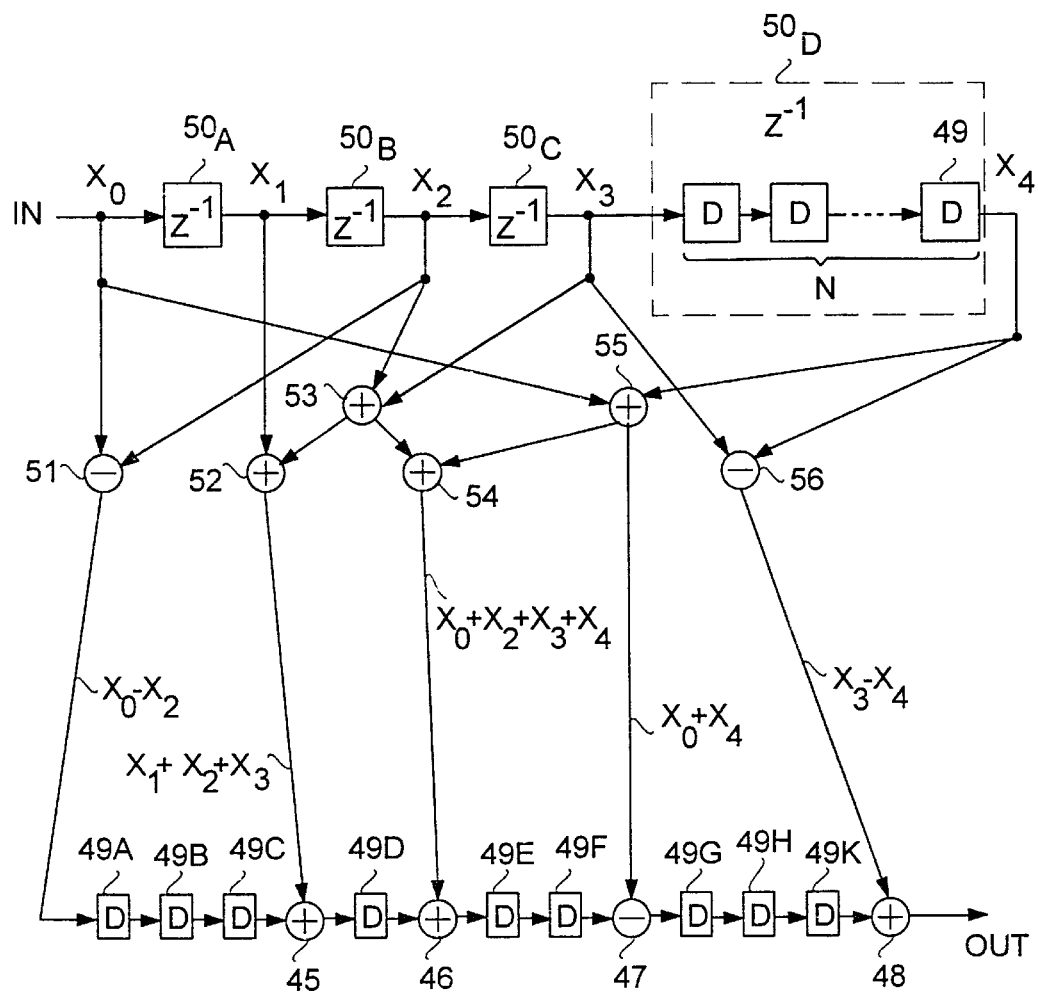
FIG. 5 is a block diagram of an embodiment of the digital filter of FIG. 4.

FIG. 5 shows the preferred embodiment of the invention, in which elements and functions similar to those in FIG. 4 are denoted by the same reference numerals and symbols. In the embodiment of FIG. 5, the delay line 50A–50D and the network of calculation elements 51–56 are identical with those of the embodiment of FIG. 4. On the other hand, the multiplier units 57A–57D and adder 58 of FIG. 4 are replaced by a common output register in FIG. 5. The output register comprises a series connection of the following elements in the given order: three one-bit delay elements 49A, 49B and 49C, an adder 45, a one-bit delay element 49D, an adder 46, two one-bit delay elements 49E and 49F, a subtractor 47, three one-bit delay elements 49G, 49H and 49K, and an adder 48. In the network of calculation elements 51–56, the output of element 51 is coupled to the input of delay element 49A, the output of element 52 is coupled to adder 45 together with the output of delay element 49C, the output of element 54 is coupled to adder 46 together with the output of delay element 49D, the output of element 55 is coupled to subtractor 47 together with the output of delay element 49F, and the output of element 56 is coupled to adder 48 together with the output of delay element 49K. The output of adder 48 provides the output OUT for the filter. The calculation elements 45, 46, 47 and 48 are bit-serial calculation elements. The embodiment of FIG. 5 employs common delays for different coefficients, thus enabling further reduction in the number of elements required for the filter. In the exemplary case, the output register comprises nine delay elements and four calculation elements, while the corresponding operation in the embodiment of FIG. 4 requires 23 delay elements and one calculation element.

The operation of the filter of the invention will be described hereinbelow with reference to the embodiment of FIG. 5. All calculation elements 51–56, 45–48 and delay elements 49A–49K of the output register are reset to zero at the start of the calculation. The advantages of the filter in accordance with the invention include the fact that all these elements can be reset simultaneously, and the resetting can be performed with a single control signal. Thereafter a new value x0 is clocked to the delay line 50A–50D, and thus the values $x_1$–$x_4$ clocked to the delay line during the previous calculation cycles are shifted one delay block forward. During the next N clock cycles, the values $x_0$, $x_1$, $x_2$, $x_3$ and $x_4$ with mutually different delays are thus derived bit by bit in bit-serial form as outputs from the delay line. The bit-serial values $x_0$–$x_4$ derived from the delay lines are applied to the bit-serial calculation network 51–56, the outputs of which yield bit-serial values $x_0$–$x_2$, $x_1$+$x_2$+$x_3$, $x_0$+$x_2$+$x_3$+$x_4$, $x_0$+$x_4$ and $x_3$–$x_4$. The values thus obtained from the calculation network 51–56 are applied in bit-serial form to the output register that combines them, simultaneously delaying them for various periods of time. As stated previously, delaying a bit-serial value for one bit corresponds to multiplying the value by two. Hence in the embodiment of FIG. 5 the output register delays the input values by 9, 6, 5, 3 and 0 bits, which corresponds to multiplying the values by 512, 64, 32, 8 and 1 respectively. Thus the value of the output OUT of the output register gives the value $$512(x_0-x_2)+64(x_1+x_2+x_3)+32(x_0+x_2+x_3+x_4)-8(x_0+x_4)+(x_3-x_4)= 536x_0+64x_1-416x_2+97x_3+23x_4=r \quad (3)$$

After the entire word to be loaded in has been clocked bit by bit to the delay line 50A–50D and the calculation network 51–56 during N clock cycles, there are still numbers significant for the calculation in the output register and in the values stored in the calculation network 51–56. In order that the final product may be outputted from the filter, clocking of the delay line 50A–50D and the calculation network 51–56 is continued for further ten clock cycles, whereupon the entire product is derived. When calculation is performed in accordance with the foregoing, the word width of the product in the filter increases considerably. If it is not desired to take advantage of this, n first bits of the product clocked from the adder 48 to the output OUT are omitted. This corresponds to dividing the product by $2^n$. If for example in the embodiment of FIG. 5 ten first output bits are omitted at the output OUT, the filter has the calculated function $$\left| \frac{512(x_0-x_2)+64(x_1+x_2+x_3)+32(x_0+x_2+x_3+x_4)-8(x_0+x_4)+(x_3-x_4)}{1024} \right| = \quad (4)$$

$$|0.5234375x_0 + 0.0625x_1 - 0.40625x_2 + 0.0947265625x_3 + 0.0224609375x_4|$$

Figure 6:
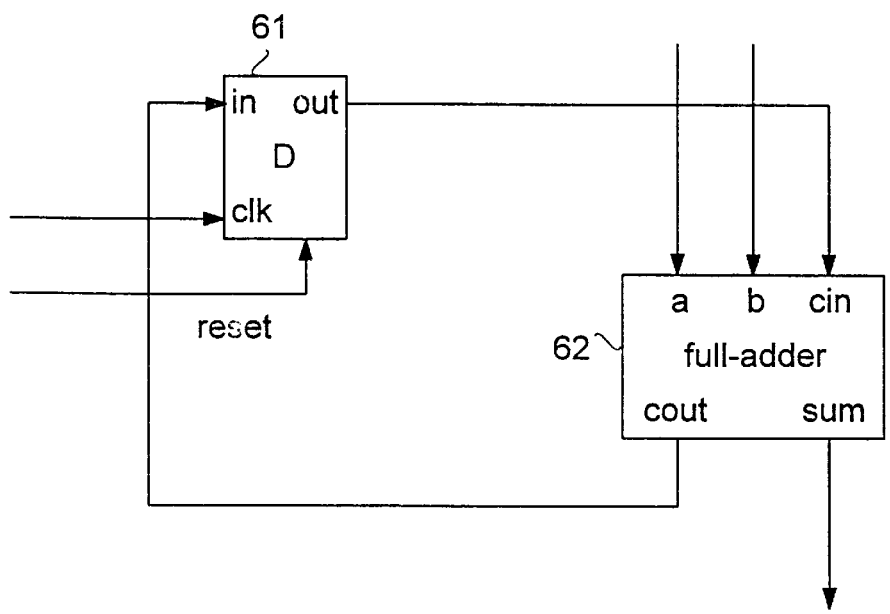
FIG. 6 is a block diagram of a bit-serial adder element.

FIG. 6 shows a block diagram of a bit-serial adder element. The adder element comprises a one-bit delay block 61, which in this exemplary case is implemented by a D flip-flop, and an adder 62 adding up two data bits and outputting a sum and a carry bit $c_{out}$. All signals shown in FIG. 6 are one-bit signals, i.e. each of them can be implemented by a single signal line. The adder element shown in FIG. 6 operates in the following way. The values to be summed together are applied to the adder 62 in serial form, the least significant bit (LSB) being the first. The adding up of two bits a and b and a carry bit $c_{in}$ gives as a result one sum bit sum and a carry bit $c_{out}$ which is stored in the delay block 61 for summing together the next bits. The delay block 61 is reset between the addition of two successive N-bit values by way of the reset line.

The bit-serial subtractor element can be embodied similarly. The only difference is that instead of an adder 62, a subtractor is employed. Furthermore, the delay block 61 is set to the value 1 between the subtraction of two successive N-bit values.

The figures and the description relating to them are only intended to illustrate the present invention. In their details, the methods and filter of the invention can vary within the purview of the accompanying claims.

What is claimed is:

1. A method for calculating a scalar product between a succession of serially ordered words of a sampled and digitized input signal in a direct-type digital FIR filter, the method comprising the steps of:

providing the succession of serially ordered words of the sampled and digitized input signal;

delaying each of the succession of serially ordered words of the sampled and digitized input signal by at least one period of a duration of the sampling of one serially ordered word of the sampled and digitized input signal;

selectively adding and subtracting in a bit serial fashion selected serially ordered words of the sampled and digitized input signal to produce a group coefficient multiplications of at least two of the serially ordered words;

bit serially multiplying the coefficient multiplications by multiple powers of two to form a plurality of partial scalar products; and bit serially summing together all the plurality of partial scalar products to yield said scalar product.

2. The method for calculating a scalar product of claim 1 wherein bit serial multiplying is accomplished by delaying each of the partial scalar products by a selected delay period to shift said scalar product to perform a multiplication by a power of two.

3. The method for calculating a scalar product of claim 1 wherein the bit serial summing is accomplished by selectively adding and subtracting the partial scalar products to accumulate the plurality of partial scalar products.

4. A method of direct-filtering of a signal comprising the steps of:

sampling and digitizing said signal to form a succession of digital words representing the amplitude of said signal;

bit wise serially ordering each digital word of said succession of digital words;

delaying each of the succession of serially ordered words of the sampled and digitized input signal by at lease one period of a duration of the sampling of one serially ordered word of the sampled and digitized input signal;

selectively adding and subtracting in a bit serial fashion selected serially ordered words of the sampled and digitized input signal to produce a group coefficient multiplications of at least two of the serially ordered words;

bit serially multiplying the coefficient multiplications by multiple powers of two to form a plurality of partial scalar products; and bit serially summing together all the plurality of partial scalar products to yield one scalar product; and converting a succession of said scalar products to a direct-filtered signal.

5. The method of direct-filtering of a signal of claim 4 wherein bit serial multiplying is accomplished by delaying each of the partial scalar products by an selected delay period to shift said scalar product to perform a multiplication by a power of two.

6. The method of direct-filtering of a signal of claim 4 wherein the bit serial summing is accomplished by selectively adding and subtracting the partial scalar products to accumulate the plurality of partial scalar products.

7. A scalar product calculator to calculate a scalar product between succession of serially ordered words of a sampled and digitized input signal in a direct-type digital FIR filter, comprising:

a plurality of word delay elements to receive the succession of serially ordered words and delay each of the succession of serially ordered words by at lease one period of a duration of the sampling of one serially ordered word of the sampled and digitized input signal;

a plurality of adder/subtractor elements connected to the plurality of word elements and interconnected with other adder/subtractor elements to selectively add and subtract in a bit serial fashion selected serially ordered words of the sampled and digitized input signal to produce a group coefficient multiplications of at least two of the serially ordered words;

a plurality of multiplication elements connected to the plurality of adder/subtractor elements to bit serially multiply the coefficient multiplications by multiple powers of two to form a plurality of partial scalar products; and a summing element interconnected with the plurality of multiplication elements to bit serially sum together all the plurality of partial scalar products to yield one scalar product.

8. The scalar product calculator of claim 7 wherein each of the multiplication elements is comprising a plurality of delaying elements to delay each of the partial scalar products by a selected delay period to shift said scalar product to perform a multiplication by a power of two.

9. The scalar product calculator of claim 7 wherein the summing element is comprising a plurality of adder/subtractor elements placed at the output of multiplication elements to accumulate the plurality of partial scalar products.

10. A digital direct-type digital filter to filter a succession of serially ordered words of a sampled and digitized input signal, comprising:

a plurality of word delay elements to receive the succession of serially ordered words and delay each of the succession of serially ordered words by at lease one period of a duration of the sampling of one serially ordered word of the sampled and digitized input signal;

a plurality of adder/subtractor elements connected to the plurality of word elements and interconnected with other adder/subtractor elements to selectively add and subtract in a bit serial fashion selected serially ordered words of the sampled and digitized input signal to produce a group coefficient multiplications of at least two of the serially ordered words;

a plurality of multiplication elements connected to the plurality of adder/subtractor elements to bit serially multiply the coefficient multiplications by multiple powers of two to form a plurality of partial scalar products;

a summing element interconnected with the plurality of multiplication elements to bit serially sum together all the plurality of partial scalar products to yield one scalar product; and a plurality of converting elements connected to the output of the summing element to convert a succession of said scalar products to a direct-filtered signal.

11. The digital direct-type digital filter of claim 10 wherein each of the multiplication elements is comprising a plurality of delaying elements to delay each of the partial scalar products by a selected delay period to shift said scalar product to perform a multiplication by a power of two.

12. The digital direct-type digital filter of claim 10 wherein the summing element is comprising a plurality of adder/subtractor elements placed at the output of multiplication elements to accumulate the plurality of partial scalar products.

13. A method for designing a direct-type digital FIR filter to filter a succession of serially ordered words of a sampled and digitized input signal, comprising the steps of:

creating a plurality of word delay elements to receive the succession of serially ordered words;

determining a delay period of each of the succession of serially ordered words, whereby each delay period is at least one period of a duration of the sampling of one serially ordered word of the sampled and digitized input signal;

configuring interconnections of a plurality of adder/subtractor elements to selectively add and subtract in a bit serial fashion selected serially ordered words of the sampled and digitized input signal to produce a group coefficient multiplications of at least two of the serially ordered words;

configuring connections of a plurality of multiplication elements to bit serially multiply the coefficient multiplications by multiple powers of two to form a plurality of partial scalar products;

determining connections of a summing element to bit serially sum together all the plurality of partial scalar products to yield one scalar product; and providing a plurality of converting elements to convert a succession of said scalar products to a direct-filtered signal.

14. The method of claim 13 wherein configuring each of the multiplication elements is configuring a plurality of delaying elements to delay each of the partial scalar products by an selected delay period to shift said scalar product to perform a multiplication by a power of two.

15. The method of claim 13 wherein providing the summing element is accomplished by creating a network of a plurality of adder/subtractor elements placed at the output of multiplication elements to accumulate the plurality of partial scalar products.

\* \* \* \* \*